(12) United States Patent
Song et al.

(10) Patent No.: US 7,486,215 B1
(45) Date of Patent: Feb. 3, 2009

(54) APPARATUS, METHOD, AND CIRCUIT FOR BASELINE LOOP ANALOG CANCELLATION

(75) Inventors: Hongxin Song, Sunnyvale, CA (US); Zining Wu, Los Altos, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 11/894,417

(22) Filed: Aug. 20, 2007

Related U.S. Application Data

(60) Provisional application No. 60/823,980, filed on Aug. 30, 2006.

(51) Int. Cl.
*H03M 3/00* (2006.01)
(52) U.S. Cl. ............................ 341/143; 341/155
(58) Field of Classification Search ......... 341/130–150
See application file for complete search history.

(56) References Cited

U.S. PATENT DOCUMENTS 5,841,814 A * 11/1998 Cupo .................. 375/321
6,381,265 B1 * 4/2002 Hessel et al. ........... 375/219
7,079,591 B2 * 7/2006 Fling et al. ............. 375/316

* cited by examiner

*Primary Examiner*—Lam T Mai

(57) ABSTRACT

Apparatuses, methods, and circuits for analog signal adjustment (or baseline loop cancellation) are disclosed. In one embodiment, an apparatus for adjusting an analog input signal includes a first mixer for combining the analog input signal and an adjustment signal; an analog signal conditioning circuit that receives an output from the first mixer and provides a conditioned analog signal; an analog-to-digital converter (ADC) that converts the conditioned analog signal to a first digital signal; a first logic block that provides a correction signal and the adjustment signal; and a second mixer that combines the first digital signal and the correction signal, and provides a digital output signal.

20 Claims, 11 Drawing Sheets

US 7,486,215 B1

APPARATUS, METHOD, AND CIRCUIT FOR BASELINE LOOP ANALOG CANCELLATION

RELATED APPLICATIONS

This application claims the benefit of U.S. Provisional Application No. 60/823,980, filed on Aug. 30, 2006, incorporated herein by reference in its entirety. This application may also be related to U.S. patent application Ser. No. 11/800,554, filed on May 4, 2007, the relevant portions of which are hereby incorporated by reference.

FIELD OF THE INVENTION

The present invention generally relates to the field of analog recording systems. More specifically, embodiments of the present invention pertain to a circuit and a method for compensating baseline offset in a read channel of an analog recording system.

DISCUSSION OF THE BACKGROUND

Analog recording systems, for example, magnetic hard drives, are used in a wide variety of commercial products, such as digital video recorders, laser printers, Voice-Over-IP devices, high definition televisions, vehicle control systems, cellular phones, storage systems (e.g., redundant arrays of independent disks, or RAIDs), desktop and laptop computers, portable audio players, personal data assistants, and digital cameras. In addition to magnetic hard drives, other analog recording systems, such as optical and magneto-optical drives, are similarly used in numerous commercial applications. Commercial products are growing more complex, and as they do so, there continues to be a growing requirement for greater storage capacities. For example, the storage capacity of commercially available magnetic hard drives for desktop computers has grown from 2 gigabytes to over 200 gigabytes in the last decade.

One method of increasing storage capacity in a recording system while maintaining substantially the same or smaller form factor includes increasing the density of the storage medium. In magnetic hard drives, the density may be increased by reducing the magnetic grain size and/or the bit size. However, in some conventional longitudinal designs (where the magnetic grains and/or bits are horizontally aligned), the storage medium densities are approaching the super-paramagnetic limit (i.e., when the energy required to change the magnetic moment of a magnetic grain approaches the ambient thermal energy). To overcome such challenges, some manufacturers are beginning to use perpendicular designs, where the magnetic grain and/or bits are vertically aligned.

While perpendicular designs can achieve greater storage medium densities, they may also require additional circuitry in the read channel. Conventional read channels of an analog recording system may include an AC-coupling circuit, an amplifier, and an analog-to-digital converter (ADC). In some analog recording systems, the AC-coupling circuit is the first element in the analog front end of the read channel and is connected to an element which reads data from the storage medium (e.g., a magnetic read head or a read head pre-amp). Generally, AC-coupling circuits are used to minimize voltage offsets between two or more components. For example, an AC-coupling circuit may reduce an offset between a read head pre-amp and associated read channel circuitry.

However, in contrast to longitudinal designs where the output of a read head corresponds to magnetic field transitions on the recording medium, a read head output in a perpendicular design corresponds to the polarization of the magnetic field. As a result, perpendicular designs have the potential of generating a constant, or nearly constant, signal output when the recording medium is uniformly magnetized. Such a constant signal output may result in the baseline (or median) output of the AC-coupling circuit drifting (or wandering) over time, which leads to a voltage offset between the read head and the read channel.

If not corrected, this baseline offset may cause an amplifier or ADC in a read channel to become saturated or to otherwise operate outside an optimal parametric range, which may result in an erroneous data reading. One conventional approach to adjusting the baseline of the signal is to include a voltage shifter in series with an AC-coupling circuit and an ADC. However, such a series approach may introduce propagation delay through the analog front end of the read channel.

Therefore, it would be desirable to provide a system that is able to adjust the baseline of an analog signal in the analog front end of a read channel without introducing propagation delay.

SUMMARY OF THE INVENTION

Embodiments of the present invention relate to circuits and methods for baseline loop analog cancellation in a read channel.

In one aspect, the invention concerns an apparatus for adjusting an analog input signal, where the apparatus can include: a first mixer for combining the analog input signal and an adjustment signal; an analog signal conditioning circuit that can receive an output from the first mixer and to provide a conditioned analog signal; an analog-to-digital converter (ADC) that can convert the conditioned analog signal to a first digital signal; a first logic block that can provide a correction signal and the adjustment signal; and a second mixer that can combine the first digital signal and the correction signal and provide a second digital signal.

In the apparatus, the ADC may provide the first digital signal to a digital signal conditioning circuit. In addition, the apparatus can include a memory with a look-up table, where the memory is coupled to the first logic block. A digital-to-analog converter (DAC) can also be included in the apparatus, where the DAC can receive a digital adjustment signal from the first logic block, and may provide an analog adjustment signal to the first mixer. Further, the apparatus can include a high-pass filter (HPF) that can provide the analog input signal.

In the apparatus, a second logic block can be included, where the second logic block can be configured to receive the second digital signal and provide a digital feedback signal to the first logic block. Also, the digital feedback signal can include a sign bit and a plurality of absolute value bits. In addition, the first logic block can include: an accumulator that can receive an output from a multiplexer, where the multiplexer can receive a gain-controlled output from a third mixer; and a delay circuit coupled to the accumulator, where the delay circuit can provide the correction signal. Also in the apparatus, the analog signal conditioning circuit can include a variable gain amplifier (VGA), a magnetoresistive (MR) asymmetry correction circuit, and a continuous time filter (CTF). Further, the digital signal conditioning circuit can include a finite impulse response (FIR) circuit coupled to an additional mixer in the conditioning circuit.

In another aspect, the invention concerns a method of adjusting an analog input signal, where the method can include: mixing the analog input signal with an analog adjustment signal to provide an adjusted analog input signal; converting the adjusted analog input signal to a first digital signal; mixing a correction signal and the first digital signal to provide a second output signal; generating a digital feedback signal from the second digital signal; and generating the analog adjustment signal and the correction signal from the second digital signal and a stored correction signal.

The method of adjusting can also include: storing a plurality of entries in a look-up table in a memory, where the entries can include the stored correction signal; providing indexing for the look-up table using a gain calibration signal, where the gain calibration is an input to a data gain converter; and receiving an output of the data gain converter and the adjusted analog input signal in a variable gain amplifier (VGA).

The method of adjusting can also include adjusting the gain calibration signal during a calibration mode. The calibration mode can also include using an auxiliary capacitor for calibrating a digital-to-analog converter (DAC), where the DAC can provide the analog adjustment signal from a digital adjustment signal. In addition, the method can include averaging the digital feedback signal, and using an accumulator for receiving a gain signal from the look-up table for providing the correction signal.

The method of adjusting can also include receiving gain ratio and time constant ratio signals in the accumulator. Also, the method can include substantially matching a first delay of a first signal path to a second delay of a second signal path, where: the first signal path includes a digital-to-analog converter (DAC), a first mixer, a variable gain amplifier (VGA), and a finite impulse response (FIR) circuit; and the second signal path includes the accumulator and a delay circuit.

In another aspect, the invention concerns a method of calibrating an analog signal adjustment process, where the method can include: characterizing a first output of an analog-to-digital converter (ADC) for an input signal, and determining a settle time for the ADC to reach that first output; characterizing a second output of the ADC after removing the input signal, and determining a delay for the ADC to reach that second output; and calibrating a gain correction signal by entering the value of the settle time and/or the delay in a look-up table.

In the method of calibrating, the step of characterizing the first output of the ADC output can include: setting a gain calibration signal to a middle setting in the look-up table, and an adjustment signal to a first value; summing a plurality of the ADC output signals; and adjusting the gain calibration signal or the adjustment signal in response to the summing.

Also in the method of calibrating, the step of characterizing the second output of the ADC can include: maintaining a gain calibration signal value; setting an adjustment signal to a first value; storing the value of the second output of the ADC after a predetermined number of clock cycles; setting the adjustment signal to a second value; and determining the time at which the ADC output signal approaches the stored value.

Also in the method of calibrating, the step of calibrating the gain calibration signal can include: setting a gain correction signal to a first value; reading an output of the ADC; determining if the output of the ADC or an adjustment signal includes a first value and writing a derived signal value therefrom into the look-up table, or, doubling or saturating the adjustment signal and repeating the step of reading an output of the ADC; and decreasing the gain calibration signal and repeating the step of reading the output of the ADC and determining if the output comprises a first value.

Also, the method of calibrating can include performing the steps of characterizing the first and second outputs of the ADC and calibrating the gain calibration signal upon detecting a power-up condition. The method can also include performing the step of calibrating the gain calibration signal upon detecting an on-the-fly enabling condition.

In another aspect, the invention concerns a circuit configured for calibration, where the circuit can include: a look-up table for storing a plurality of entries, where the entries can include an analog-to-digital converter (ADC) output, and a plurality of least significant bit (LSB) values for a digital-to-analog converter (DAC); a circuit for generating a gain calibration signal for providing indexing for the look-up table, and an input to a data gain converter; and a variable gain amplifier (VGA) for receiving an output of the data gain converter, and a grounded level when in a calibration mode, and a high-pass filter (HPF) output when not in the calibration mode, where an output of the VGA is configured to be adjusted by a coefficient.

Also in the circuit, the coefficient can be grounded during the calibration mode. In addition, an auxiliary capacitor may be configured for calibration of the DAC. Further, the circuit can also include a low-pass filter (LPF) coupled to the DAC and a mixer, where the mixer can be coupled to the VGA.

The present invention advantageously provides a circuit and method for compensating baseline offset (or baseline "wander") in a read channel. These and other advantages of the present invention will become readily apparent from the detailed description of preferred embodiments below.

DETAILED DESCRIPTION OF THE PREFERRED EMBODIMENTS

Figure 1:
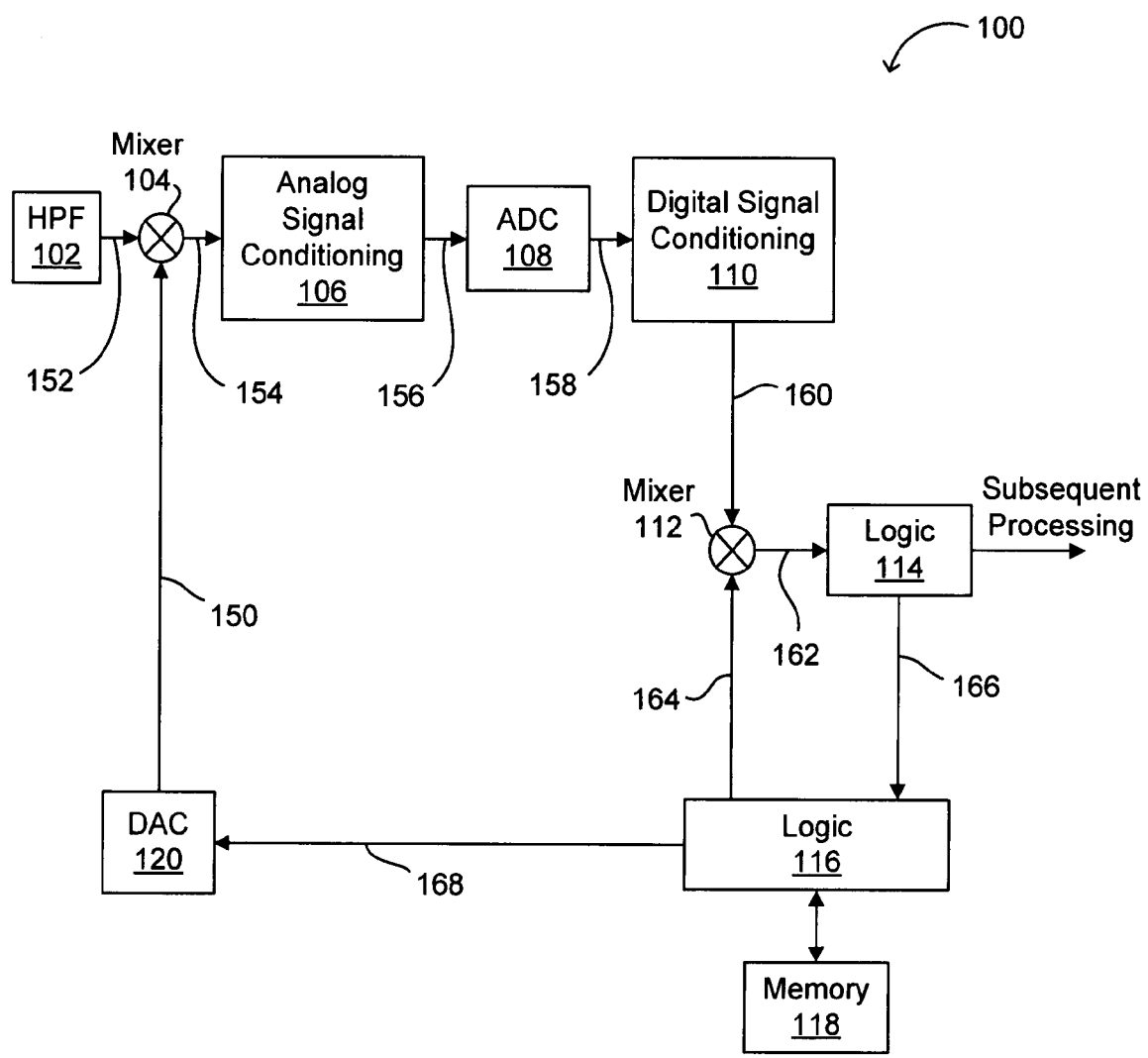
FIG. 1 is a block diagram showing an exemplary baseline loop in accordance with embodiments of the present invention.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of processes, procedures, logic blocks, functional blocks, processing, and other symbolic representations of operations on data bits, data streams or waveforms within a computer, processor, controller and/or memory. These descriptions and representations are generally used by those skilled in the data processing arts to effectively convey the substance of their work to others skilled in the art. A process, procedure, logic block, function, operation, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer, data processing system, or logic circuit. It has proven convenient at times, principally for reasons of common usage, to refer to these signals as bits, waves, waveforms, streams, values, elements, symbols, characters, terms, numbers, or the like.

It should be borne in mind, however, that all of these and similar terms are associated with the appropriate physical quantities and are merely convenient labels applied to these quantities. Unless specifically stated otherwise and/or as is apparent from the following discussions, it is appreciated that throughout the present application, discussions utilizing terms such as "processing," "operating," "computing," "calculating," "determining," "manipulating," "transforming," or the like, refer to the action and processes of a computer, data processing system, logic circuit or similar processing device (e.g., an electrical, optical, or quantum computing or processing device), that manipulates and transforms data represented as physical (e.g., electronic) quantities. The terms refer to actions, operations and/or processes of the processing devices that manipulate or transform physical quantities within the component(s) of a system or architecture (e.g., registers, memories, other such information storage, transmission or display devices, etc.) into other data similarly represented as physical quantities within other components of the same or a different system or architecture.

Furthermore, for the sake of convenience and simplicity, the terms "signal(s)" and "waveform(s)" may be used interchangeably, however, these terms are also given their art recognized meanings. Also, for convenience and simplicity, the terms "baseline", "baseline voltage", and "baseline signal" may be used interchangeably, as well as the terms "baseline offset", "baseline wander", "baseline drift", "DC wander", and "DC drift", and in general, use of one such form generally includes the others, unless the context of the use unambiguously indicates otherwise. The terms "node(s)", "input(s)", "output(s)", and "port(s)" may be used interchangeably, as may the terms "connected to", "coupled with", "coupled to", and "in communication with" (which terms also refer to direct and/or indirect relationships between the connected, coupled and/or communicating elements, unless the context of the term's use unambiguously indicates otherwise). However, these terms are also given their art recognized meanings.

The invention, in its various aspects, will be explained in greater detail below with regard to exemplary embodiments.

An Exemplary Apparatus for Analog Signal (Baseline Loop) Adjustment or Cancellation Referring now to FIG. 1, a block diagram showing an exemplary analog signal processing circuit (or "baseline loop") in accordance with embodiments of the present invention is indicated by the general reference character 100. High-pass filter (HPF) 102 can receive a signal from a pre-amplifier, for example, and provide an analog input signal (e.g., 152) to mixer (e.g., a configurable current element) 104. Mixer 104 can receive the analog input signal, as well as an analog adjustment signal (e.g., 150), and may provide an input (e.g., 154) to analog signal conditioning circuit 106. Analog-to-digital converter (ADC) 108 can receive a conditioned analog signal (e.g., 156) from analog signal conditioning circuit 106, and may provide a digital signal (e.g., 158) to a digital signal conditioning circuit 110.

Mixer 112 can receive an output from the digital signal conditioning circuit 110, as well as a baseline correction signal (e.g., 164) from logic block 116, and may provide a digital output signal (e.g., 162) to logic block 114 for subsequent processing. Also, logic block 114 can provide a digital feedback signal (e.g., 166) to logic block 116. Logic block 116 can also interface with memory 118, and may provide the baseline correction signal (e.g., 164) and a digital adjustment signal (e.g., 168) input to digital-to-analog converter (DAC) 120. Memory 118 can be any type of hardware memory (e.g., static random access memory (SRAM)), and may include look-up tables, for example. Further, DAC 120 can provide analog adjustment signal 150 to mixer 104.

Figure 2:
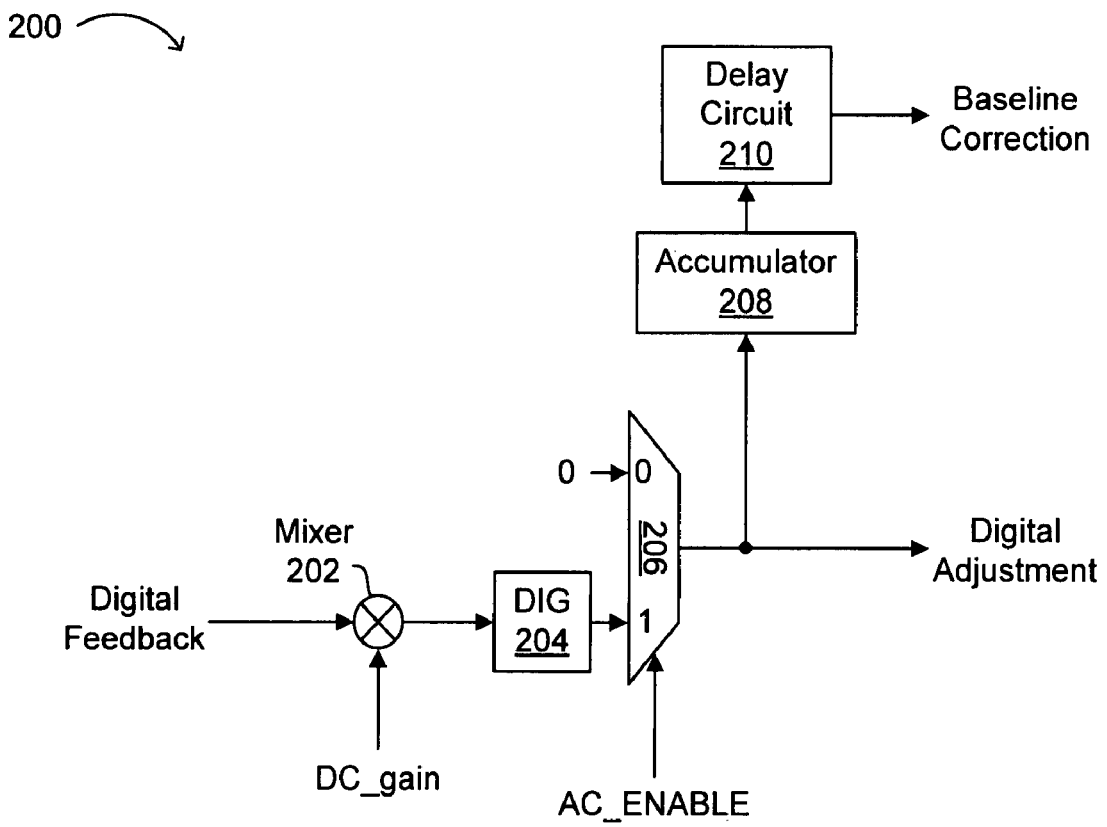
FIG. 2 is a block diagram showing an exemplary baseline correction generator in accordance with embodiments of the present invention.

Referring now to FIG. 2, a block diagram showing an exemplary baseline correction generator (e.g., logic block 116 of FIG. 1) in accordance with embodiments of the present invention is indicated by the general reference character 200. A digital feedback signal, or representation thereof, can be provided to mixer 202, along with a gain control signal (e.g., DC_gain). DAC input generation (DIG) 204 can receive an output from mixer 202, and provide one input to multiplexer 206, which can be controlled by signal AC_ENABLE, for example. Multiplexer 206 can provide a digital adjustment signal to accumulator 208. Delay circuit 210 can receive an accumulated signal from accumulator 208, and may provide the baseline correction signal.

Generally, embodiments of the present invention can essentially relate to normalization of an input signal from a high pass filter to a zero offset when an otherwise large offset would occur. Such a large offset may occur due to an HPF accumulating charge which may result in the ADC becoming "railed" over time. Here, read channel integrity can be maintained by adding a first signal to an input, and a second signal to an output, of an ADC.

Figure 3:
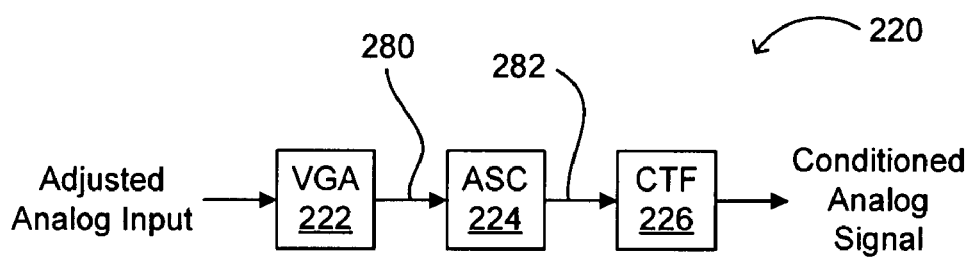
FIG. 3 is a diagram showing an exemplary analog signal conditioning block in accordance with embodiments of the present invention.

Referring now to FIG. 3, a diagram showing an exemplary analog signal conditioning block (e.g., block 106 of FIG. 1) in accordance with embodiments of the present invention is indicated by the general reference character 220. Variable gain amplifier (VGA) 222 can receive an adjusted analog input signal, and may provide an amplified version of that input signal to a magnetoresistive (MR) asymmetry correction (ASC) circuit 224. For example, ASC 224 can be used to make a distorted signal more symmetrical. Also, the output of ASC 224 can be filtered (e.g., using continuous time filter (CTF) 226, as opposed to a discrete time interval based filter), and may provide a conditioned analog signal.

Figure 4:
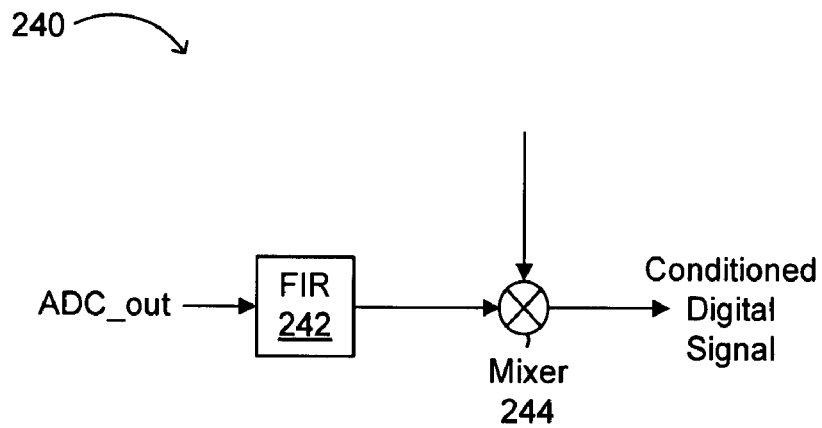
FIG. 4 is a diagram showing an exemplary digital signal conditioning block in accordance with embodiments of the present invention.

Referring now to FIG. 4, a diagram showing an exemplary digital signal conditioning circuit (e.g., 110 of FIG. 1) in accordance with embodiments of the present invention is indicated by the general reference character 240. Finite impulse response (FIR) circuit 242 can receive an ADC output signal, and may provide a signal to mixer 244, which may also receive an FIR out-scale signal.

Figure 5:
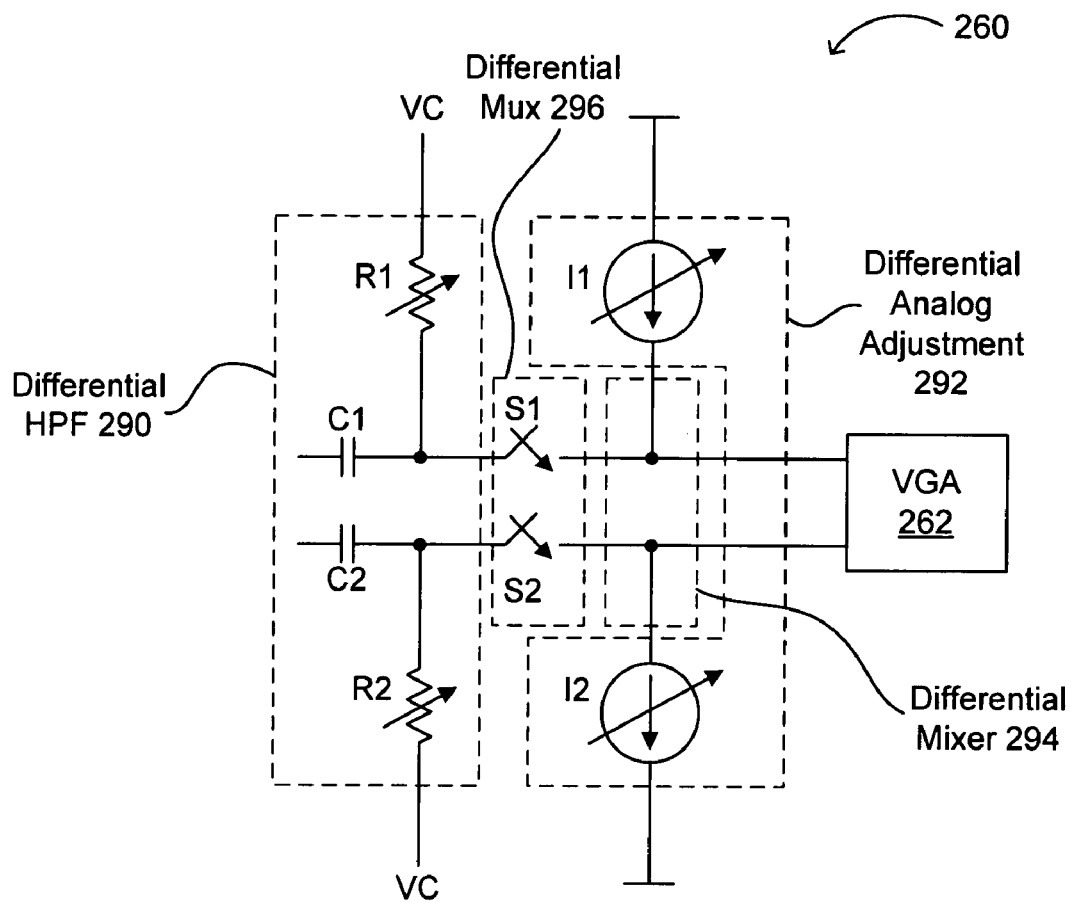
FIG. 5 is a diagram showing an exemplary analog cancellation circuit suitable for use in accordance with embodiments of the present invention.

Referring now to FIG. 5, a diagram showing an exemplary analog cancellation circuit suitable for use in accordance with embodiments of the present invention is indicated by the general reference character 260. The capacitor and resister pairs (e.g., C1/R1 and C2/R2) can form differential high pass filter (HPF) structure 290, current sources I1 and I2 can represent differential analog adjustment portion 292, switches S1 and S2 can represent differential mux 296, and differential mixer 294 can be represented by current junctions connecting to VGA 262, as shown.

An Exemplary Method and Circuit for Adjusting an Analog Input Signal

Figure 6:
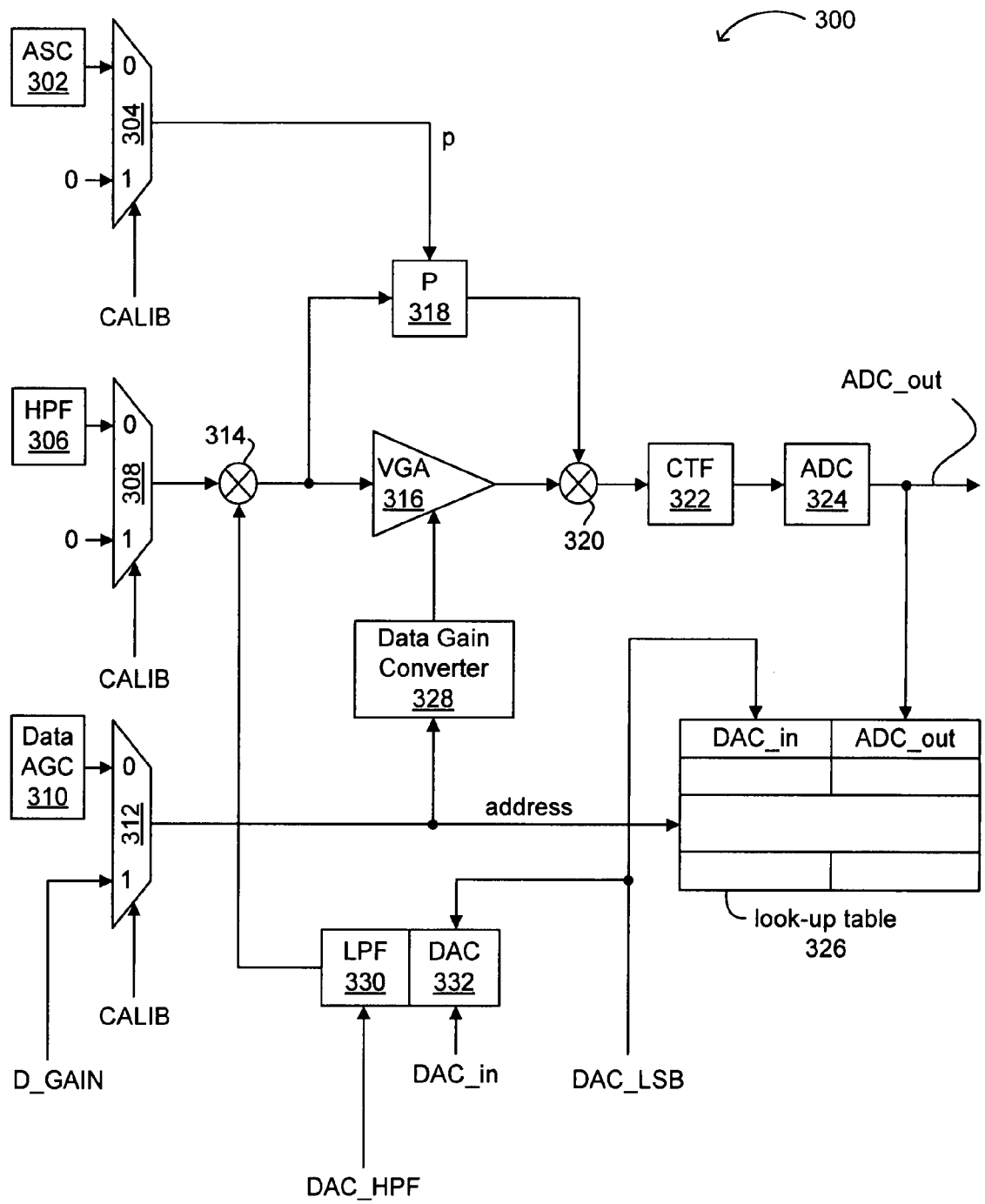
FIG. 6 is a diagram showing an exemplary calibration circuit in accordance with embodiments of the present invention.

Referring now to FIG. 6, a diagram showing an exemplary calibration circuit in accordance with embodiments of the present invention is indicated by the general reference character 300. The particular exemplary circuit structure shown in FIG. 6 generally represents a more detailed version of aspects of FIG. 1, adapted for adjusting an analog input signal and calibrating such an adjustment method.

Generally, calibration may be performed for the circuit between DAC 332 and ADC 324 for different VGA 316 gain settings. An output of ASC 302 can be received at one input of mux 304, and the other input of mux 304 can be grounded. Similarly, an output of HPF 306 can be received at one input of mux 308, and the other input of mux 308 can be grounded. Also, an output of data AGC 310 can be received at one input of mux 312, and the other input of mux 312 can receive D_GAIN (see, e.g., Table 1 below). Further, each of muxes 304, 308, and 312 can be controlled by CALIB such that the "0" input is selected in a non-calibration mode, while the "1" input is selected during calibration.

Thus, during calibration, the HPF 306 output may be effectively replaced by ground, ASC 302 coefficient p (input to P 318) may be set to zero, and the AGC loop may be replaced with desired gain values. After calibration is finished, the HPF 306 output, p, and the AGC loop may be restored.

Mixer 314 can receive a mux 308 output and a low-pass filtered (LPF) 330 output of the DAC 332. Mixer 320 can receive an output of P 318 and an output of VGA 316, and may provide an input to CTF 322. ADC 324 can receive an output of CTF 322, and may provide an ADC output signal, as shown in look-up table 326. During calibration, a look-up table 326 can be generated, which can be in a format of an analog cancellation gain table (see, e.g., Table 1 below). Look-up table 326 may be indexed by D_GAIN, which can also be provided to data gain converter 328. During calibration, values for DAC_IN and ADC_OUT may be filled in Table 1, for example.

TABLE 1

| Index | D_GAIN[7:0] | DAC_IN[5:0] | ADC_OUT[4:0] |
|---|---|---|---|
| 0 | | 02h | |
| 1 | | 06h | |
| 2 | | 0Ah | |
| ... | | ... | |
| 62 | | FAh | |
| 63 | | FEh | |

Figure 7:
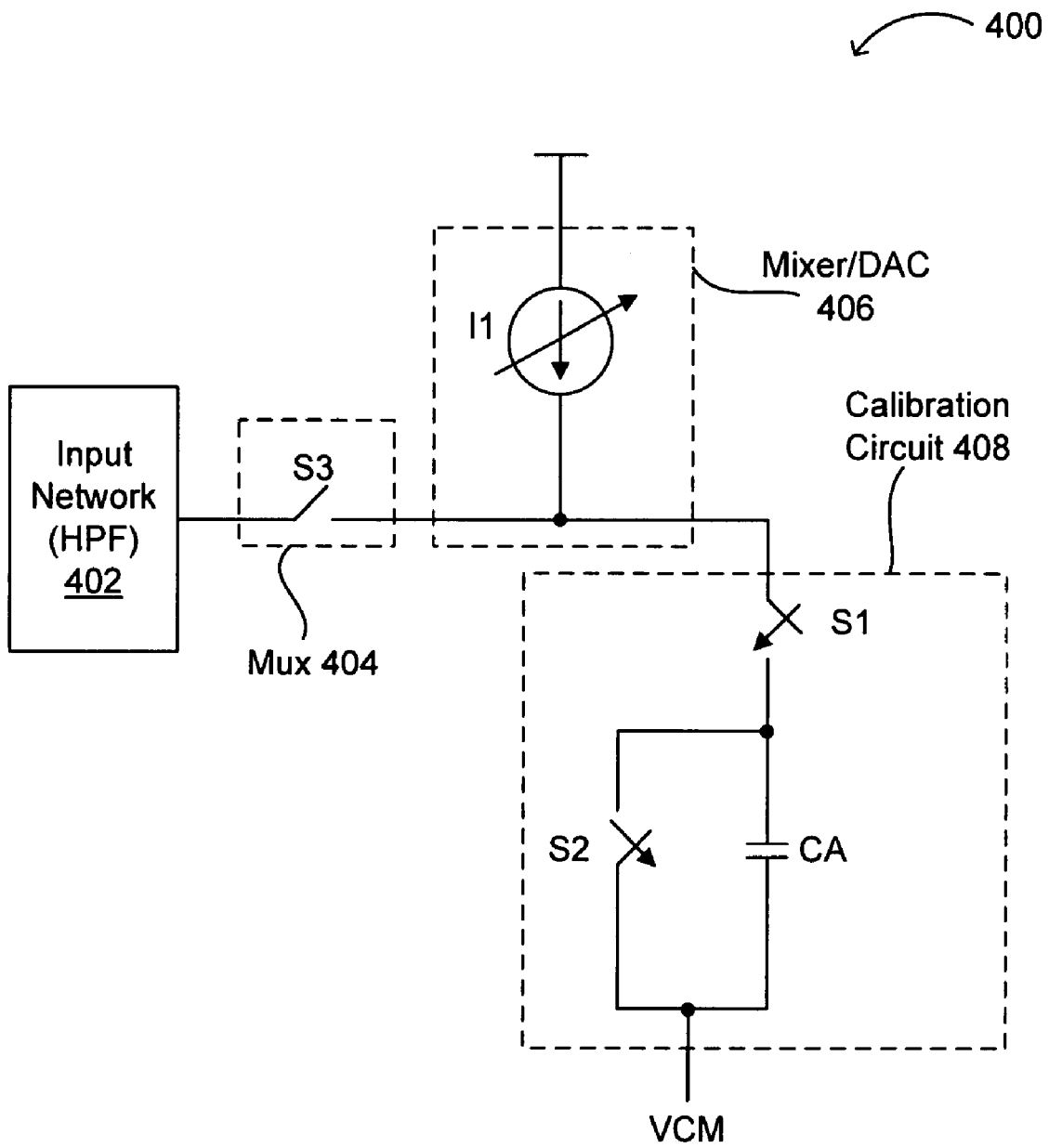
FIG. 7 is a diagram showing another calibration circuit suitable for use in accordance with embodiments of the present invention.

Referring now to FIG. 7, a diagram showing another calibration circuit suitable for use in accordance with embodiments of the present invention is indicated by the general reference character 400. An auxiliary capacitor CA (e.g., having a capacitance of 2*C/15, where C is the capacitance of capacitor C1 and/or capacitor C2 of FIG. 5) can be used for DAC calibration. Input network 402 (e.g., HPF) can be coupled via mux 404 (e.g., as represented by switch S3) to a node receiving current via I1 (e.g., mixer/DAC 406). Also, calibration circuit 408 can be enabled via switch S1. Switch S2 can be in parallel with the auxiliary capacitor, and coupled to a common voltage reference (e.g., VCM). Switch S2 can generally be used to discharge the auxiliary capacitor CA.

Figure 8:
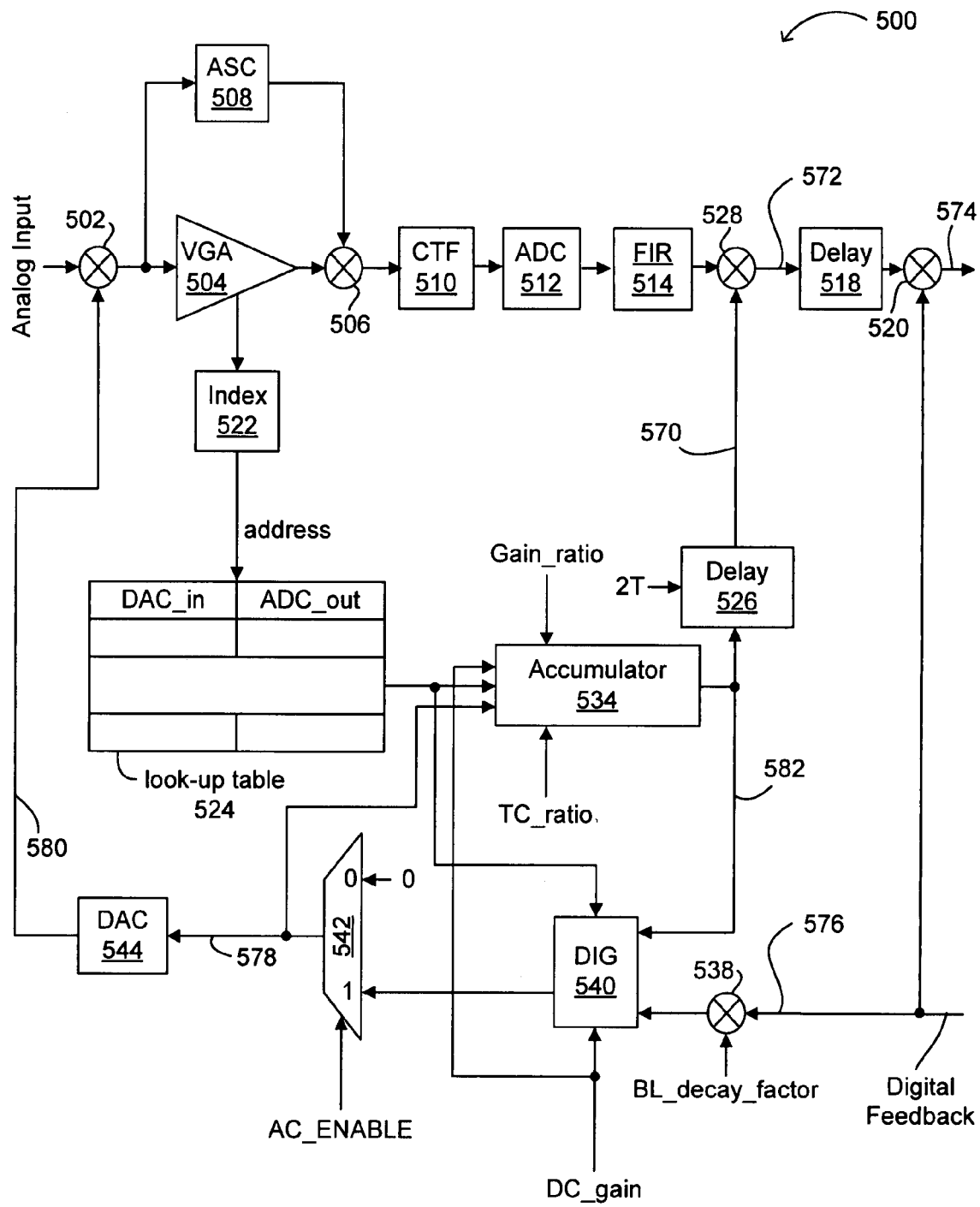
FIG. 8 is a diagram showing an exemplary apparatus for baseline loop analog cancellation in accordance with embodiments of the present invention.

Referring now to FIG. 8, a diagram showing an exemplary apparatus for baseline loop analog cancellation in accordance with embodiments of the present invention is indicated by the general reference character 500. The particular example circuit structure shown in FIG. 8 can represent a more detailed version of the diagram of FIG. 1, adapted for use in analog signal adjustment. An analog input signal can be received at mixer 502, an output of which can connect to VGA 504 and to ASC 508. One output of VGA 504 can connect to mixer 506, along with an output of ASC 508. Mixer 506 can provide a signal to CTF 510, with an output to ADC 512, with an output to FIR 514. The output of FIR 514 may, optionally, be mixed with an FIR outscale signal. The output of FIR 514 may then connect to mixer 528, which can output digital signal 572 to delay 518, an output of which can connect to mixer 520 to provide output signal 574.

A digital feedback signal can be input to mixer 538. Optionally, the digital signal can first be averaged and then provided to mixer 538. Mixer 538 may also be configured to receive a baseline loop decay factor signal (e.g., BL_decay_factor). DAC_IN generation circuit (DIG) 540 can receive an output from mixer 538, as well as an output from look-up table 524, and an output of accumulator 534 (e.g., accum_out 582). DIG 540 can provide one input to mux 542, which can provide digital adjustment signal 578 to DAC 544 and accumulator 534. DAC 544 can provide analog adjustment signal 580 to mixer 502. Also, VGA 504 can provide, via index block 522, an address or index for look-up table 524 corresponding to the current gain setting. An output of look-up table 524 can connect to accumulator 534, as well as to DIG 540, for example. Further, delay 526 can output a baseline correction signal (e.g., 570) to mixer 528.

Accumulator 534 generally accumulates analog correction signal 580 in the digital domain. The effect of analog correction (e.g., at mixer 502) may be effectively "undone" by digital mixer 528. As a result, signal 572 contains little or no effect from the analog baseline loop. Thus, signal 572 can later be compensated by a more accurate digital loop (not shown) with a digital feedback signal. Accumulator 534 can be governed by the following equation, where TC_ratio may be used to model an uncertainty of the time constant of the DAC 544, Gain_ratio may be used to model the uncertainty of the gain calibration, and DC_gain refers to the direct current gain of the FIR (e.g., the sum of all FIR taps):

$$\text{Accum\_out}(t) = \text{Accum\_out}(t-1) \times \text{TC\_ratio} + \left(\frac{\text{DAC\_IN}}{\text{DAC\_in}[ind]} \times \text{ADC\_out}[ind] \times \text{Gain\_ratio} \times \text{DC\_gain}\right)$$

Also, DAC_IN generation (DIG) can include computing one or more (preferably all) of the following:

$$\phi_1 = \text{digital\_feedback} \times BL\_\text{decay\_factor} - \text{accum\_out}$$

$$\phi_2 = ADC\_\text{out}[ind] \times DC\_\text{gain} \times \text{Gain\_ratio}$$

and $$DAC\_IN = \begin{cases} DAC\_in[ind], & \text{if } \phi_1 \geq \phi_2 \\ DAC\_in[ind]/2, & \text{if } \phi_2 > \phi_1 \geq \phi_2/2 \\ 0, & \text{if } \phi_2/2 > \phi_1 > -\phi_2/2 \\ -DAC\_in[ind]/2, & \text{if } -\phi_2/2 \geq \phi_1 > -\phi_2 \\ -DAC\_in[ind], & \text{if } \phi_1 \leq -\phi_2 \end{cases}$$

For delay matching, a first signal path 1 can be from DAC input mux 542, through DAC 544, mixer 502, VGA 504, mixer 506, CTF 510, ADC 512, to FIR 514 output via mixer 516, to mixer 528. A second signal path can be from the same starting point, but through accumulator 534, delay 526, to mixer 528. Thus, the first and second and signal paths have the same ending point. Preferably, these two paths are designed to have substantially the same delay by adjusting the amount of delay provided by delay 526.

An Exemplary Method of Analog Signal Adjustment Calibration

An exemplary calibration method can include calibrating the ADC output value and settle time, calibrating the ADC DC residual value and delay, and/or calibrating the gain, or more fully, calibrating an adjustment value for one or more VGA gain settings. In addition, there may be two types of calibration modes: full calibration and "on-the-fly" calibration. Full calibration can be performed when a power-up condition is detected, or when changes are made to associated DAC and/or CTF variables, All three calibration steps above can be performed for full calibration. For "on-the-fly" calibration, which can occur when enabled at the end of a read procedure (e.g., on a transition of a read gate signal RGATE to an inactive state), the third calibration step above may be performed for a particular VGA gain setting (i.e., the adjustment value is calibrated for the current VGA gain setting). Further, a control signal (e.g., CALIB_INIT) may be set to initiate a full calibration and then be automatically cleared after the calibration is finished.

ADC Calibration: Output Value and Settle Time

In this step, an ADC output can be observed for a given input value in order to characterize the ADC. For settle time, a determination of how many cycles can be made for the ADC to reach its steady state output. Thus, a determination of when an added adjustment signal can be subtracted back out can be made. First, D_GAIN may be set to a middle setting in the look-up table. At t=0, a setting of DAC_IN=4, or some other suitable "middle" value, which may be experimentally derived, can be made. After a period of time (e.g., an ADC pipeline delay, such as t=4 T), the ADC output may be captured and operated on. Each of the W_calib ADC output samples may be summed together, where W_calib can be the programmable window size, e.g., either 4 or 8. In one example, a maximum of 16 windows may be processed in calibrating the ADC output value (e.g., a 6-bit ADC output value) and settle time. For example, each i-th window may be characterized by:

$$S_i = \sum_{k=0}^{W\_calib-1} ADC(t = i \times W\_calib + k)$$

If $$i = 15 \text{ or } \frac{S_i}{W\_calib} = \frac{S_{i-1}}{W\_calib}$$

(6-bit) for some $1 \leq i < 15$, depending on $$\frac{S_{i-1}}{W\_calib},$$

the output value and settle time may be characterized as follows:

Case 1: When $$16 \leq \frac{S_{i-1}}{W\_calib} < 31,$$

the ADC output settle time may be characterized as D_ADC_SETTLE=4+i×W_calib, and the settled ADC output value can be characterized as $$ADC\_SETTLE = \frac{S_i}{W\_calib}.$$

In this case, the output value and settle time calibration step is done.

Case 2: When $$\frac{S_i}{W\_calib} < 16,$$

increase D_GAIN by 10h (saturated at FFh), and repeat the output value and settle time calibration step.

Case 3: When $$\frac{S_i}{W\_calib} = 31,$$

decrease D_GAIN by 10h, and repeat the output value and settle time calibration step.

ADC Calibration: DC Residual Value and Delay

In this step, a determination is made as to the magnitude of any residual voltage and the related delay after removing a given input. The value of D_GAIN can be maintained as in the ADC output and settle time calibration discussed above. At t=0, a setting of DAC_IN=0 can be made. After waiting D_ADC_SETTLE clock cycles (e.g., ADC settle time as determined in the ADC output value and settle time calibration step above), a residual ADC output (e.g., a DC residual value out of the ADC) can be read, and saved as ADC_

DC_RSDL. The counter can then be reset to t=0. At t=0, a setting of DAC_IN=4 can be made. At t=4 T (e.g., ADC pipeline delay, as above), processing of the ADC output can begin, effectively finding a delay midpoint of where the ADC has settled, for example.

$$\text{If } ADC(k-1) \leq \frac{ADC\_SETTLE}{2} \text{ and}$$
$$ADC(k) \geq \frac{ADC\_SETTLE}{2}, D\_ADC = k \text{ clock cycles.}$$

Gain Calibration

In this step, the look-up table can be populated with ADC_OUT and DAC_IN values. In full calibration mode, as described above, ADC_OUT and DAC_IN values may be populated for all corresponding VGA gain settings, whereas in the on-the-fly case, the look-up table entry corresponding to only the current VGA setting can be updated. In one particular example, first a setting of D_GAIN can be made (e.g., to the last row in Table 1). Next, at t=0, a setting of DAC_IN=2, or some other experimentally determined and/or relatively small gain value, can be made. A general flow including three steps can be as follows, where this process may be repeated until D_GAIN=02h (e.g., the first row in Table 1). Further, if ADC_OUT(D_ADC_SETTLE)<16 while DAC_IN=31, this can suggest that the DAC range is insufficient at relatively low gain.

Step 1: At t=D_ADC_SETTLE, read ADC_OUT. If ADC_OUT(D_ADC_SETTLE)≧16 or DAC_IN=31, write (ADC_OUT(D_ADC_SETTLE)–ADC_DC_RSDL)*Cap_ratio, where Cap_ratio_relates to a capacitor ratio (which may be empirically determined for a given ADC and/or for a given ratio between C and the capacitance of CA in FIG. 7), into the row in Table 1 corresponding to current D_GAIN (e.g., in the DAC_IN column corresponding to the index), and then go to Step 3. Otherwise, go to Step 2.

Step 2: Reset counter. Double DAC_IN or saturate DAC_IN to 31. Then, go back to Step 1.

Step 3: Reset counter. Decrease D_GAIN to the next smaller value in the look-up table. Go to Step 1. If D_GAIN can not be decreased (e.g., the table has been fully populated for all gain calibration settings), the gain calibration step is completed.

As discussed above, for "on-the-fly" calibration, a row index in Table 1 having a D_GAIN value that is closest to a current D_GAIN value can be identified. Next, calibration can be performed for the current VGA gain, as described in the gain calibration section above. Finally, restoration can be performed. However, if some outside event (e.g., RGATE, SGATE, etc.) comes before ADC_OUT is read out at t=D_ADC_SETTLE, such on-the-fly calibration may be stopped, and restoration may be started.

Figure 9:
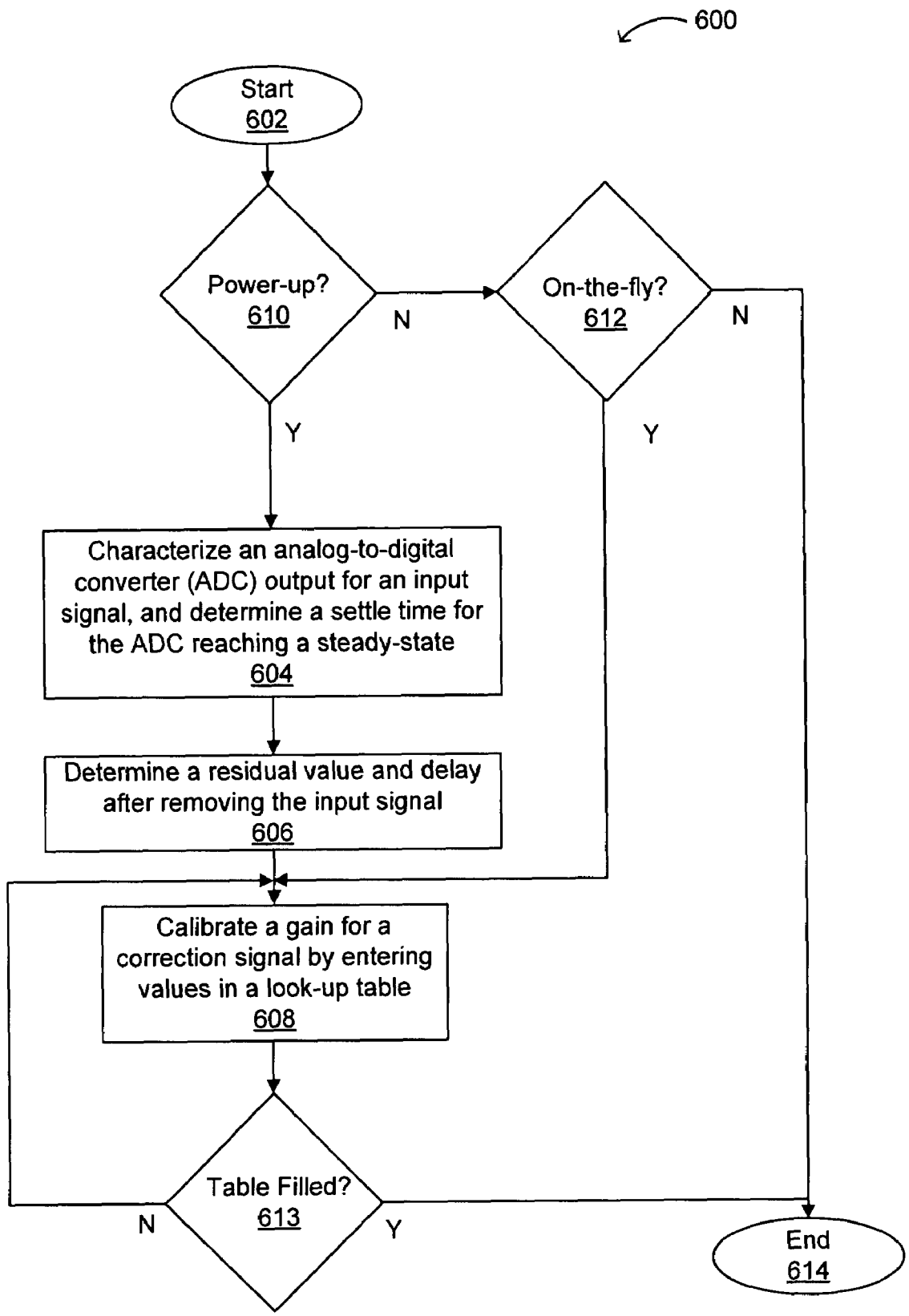
FIG. 9 is a flow diagram showing an exemplary method of analog cancellation calibration in accordance with embodiments of the present invention.

Referring now to FIG. 9, a flow diagram showing an exemplary method of analog cancellation calibration in accordance with embodiments of the present invention is indicated by the general reference character 600. The flow can begin (602) and on power-up (610), an ADC output for an input signal can be characterized and a determination of a settle time for the ADC reaching a steady state can be determined (604) and a residual value and delay can be determined (606). Subsequently, one or more gain settings can be calibrated for a correction signal by entering values into a look-up table (608). As discussed above, on-the-fly calibration (612) includes calibrating a gain for a correction signal corresponding to the current gain setting (608), and does not include filling the look-up table.

The step of characterizing an analog-to-digital converter (ADC) output for an input signal, and determining a settle time for the ADC reaching a steady-state (604) can include setting a gain calibration signal to a middle setting in a gain table and an adjustment signal to a middle value, summing a plurality of ADC output signals, and adjusting the gain calibration signal or the ADC output signal in response to the summation. If the result of the summation indicates that the ADC output value has settled, the settled value and the settled time are recorded. If the result of the summation indicates that the gain calibration signal is above or below a certain range, the gain calibration signal is adjusted accordingly and this step is repeated.

The step of determining a residual value and delay after removing the input signal (606) can include maintaining a gain calibration signal value from step 604 above, setting an adjustment signal to zero, reading the ADC output signal after a predetermined number of clock cycles (e.g., the settle time as determined in step 604 above), storing the value of the output signal, setting the adjustment signal to a middle value, and determining and recording the time at which the ADC output signal approaches the settle value as determined in step 604 above.

A gain can be calibrated for a correction signal by entering values in a look-up table (608), and this step can include indexing the table by a first gain setting, reading the ADC output signal, determining if the output of the ADC is one of a first set of values, and if so, writing a derived value therefrom into the look-up table, and if not, doubling an adjustment signal, and decreasing the gain to a next smaller value, and repeating the step of reading the ADC and determining if the output is of a first set of values. As such, until the table has been filled (e.g., indicating that all gain entries have been calibrated), the step of reading and determining the ADC output signal will repeat, each time with a different gain value. In on-the-fly calibration, the gain entry corresponding to the current VGA gain setting may be calibrated alone, without calibrating the gain for the entire table.

Exemplary Systems Using the Present Circuit

In a further aspect of the invention, a system may comprise the present apparatus or circuit for charge based correction of baseline wander. Various exemplary implementations of the present invention are shown in FIGS. 10A-10G.

Figure 10A:
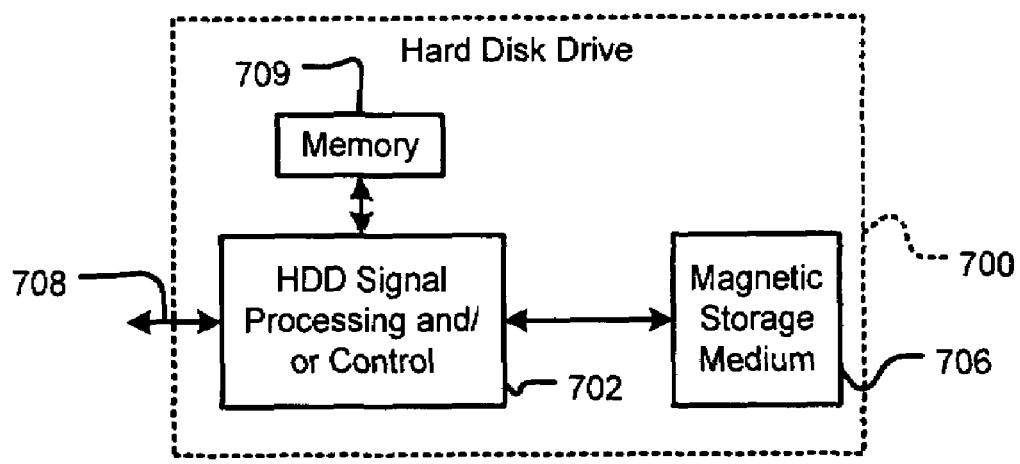
FIGS. 10A-10G are diagrams showing exemplary systems in which the present invention may be used.

Referring now to FIG. 10A, the present invention can be implemented in a hard disk drive (HDD) 900. The present invention may implement either or both signal processing and/or control circuits, which are generally identified in FIG. 10A at 902. In some implementations, the signal processing and/or control circuit 902 and/or other circuits (not shown) in the HDD 900 may process data, perform coding and/or encryption, perform calculations, and/or format data that is output to and/or received from a magnetic storage medium 906.

The HDD 900 may communicate with a host device (not shown) such as a computer, mobile computing devices such as personal digital assistants, cellular phones, media or MP3 players and the like, and/or other devices via one or more wired or wireless communication links 908. The HDD 900 may be connected to memory 909 such as random access memory (RAM), low latency nonvolatile memory such as flash memory, read only memory (ROM) and/or other suitable electronic data storage.

Figure 10B:
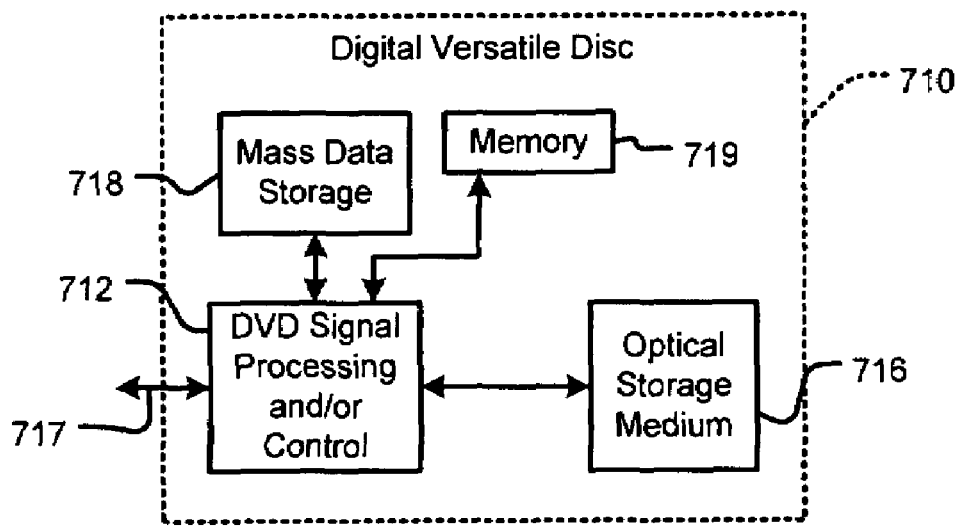

Referring now to FIG. 10B, the present invention can be implemented in a digital versatile disc (DVD) drive 910. The present invention may implement either or both signal processing and/or control circuits, which are generally identified in FIG. 10B at 912, and/or mass data storage 918 of the DVD drive 910. The signal processing and/or control circuit 912 and/or other circuits (not shown) in the DVD 910 may process data, perform coding and/or encryption, perform calculations, and/or format data that is read from and/or data written to an optical storage medium 916. In some implementations, the signal processing and/or control circuit 912 and/or other circuits (not shown) in the DVD 910 can also perform other functions such as encoding and/or decoding and/or any other signal processing functions associated with a DVD drive.

The DVD drive 910 may communicate with an output device (not shown) such as a computer, television or other device via one or more wired or wireless communication links 917. The DVD 910 may communicate with mass data storage 918 that stores data in a nonvolatile manner. The mass data storage 918 may include a hard disk drive (HDD). The HDD may have the configuration shown in FIG. 10A. The HDD may be a mini HDD that includes one or more platters having a diameter that is smaller than approximately 1.8". The DVD 910 may be connected to memory 919 such as RAM, ROM, low latency nonvolatile memory such as flash memory and/or other suitable electronic data storage.

Figure 10C:
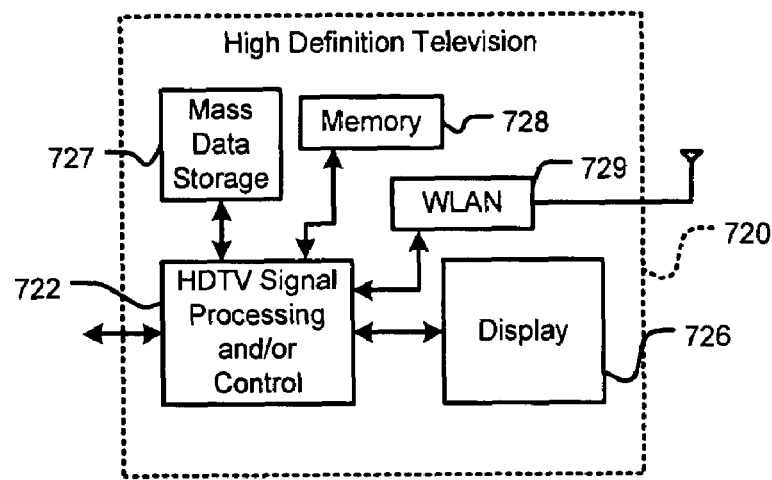

Referring now to FIG. 10C, the present invention can be implemented in a high definition television (HDTV) 920. The present invention may implement either or both signal processing and/or control circuits, which are generally identified in FIG. 10C at 922, a WLAN interface and/or mass data storage of the HDTV 920. The HDTV 920 receives HDTV input signals in either a wired or wireless format and generates HDTV output signals for a display 926. In some implementations, signal processing circuit and/or control circuit 922 and/or other circuits (not shown) of the HDTV 920 may process data, perform coding and/or encryption, perform calculations, format data and/or perform any other type of HDTV processing that may be required.

The HDTV 920 may communicate with mass data storage 927 that stores data in a nonvolatile manner such as optical and/or magnetic storage devices. At least one HDD may have the configuration shown in FIG. 10A and/or at least one DVD may have the configuration shown in FIG. 10B. The HDD may be a mini HDD that includes one or more platters having a diameter that is smaller than approximately 1.8". The HDTV 920 may be connected to memory 928 such as RAM, ROM, low latency nonvolatile memory such as flash memory and/or other suitable electronic data storage. The HDTV 920 also may support connections with a WLAN via a WLAN network interface 929.

Figure 10D:
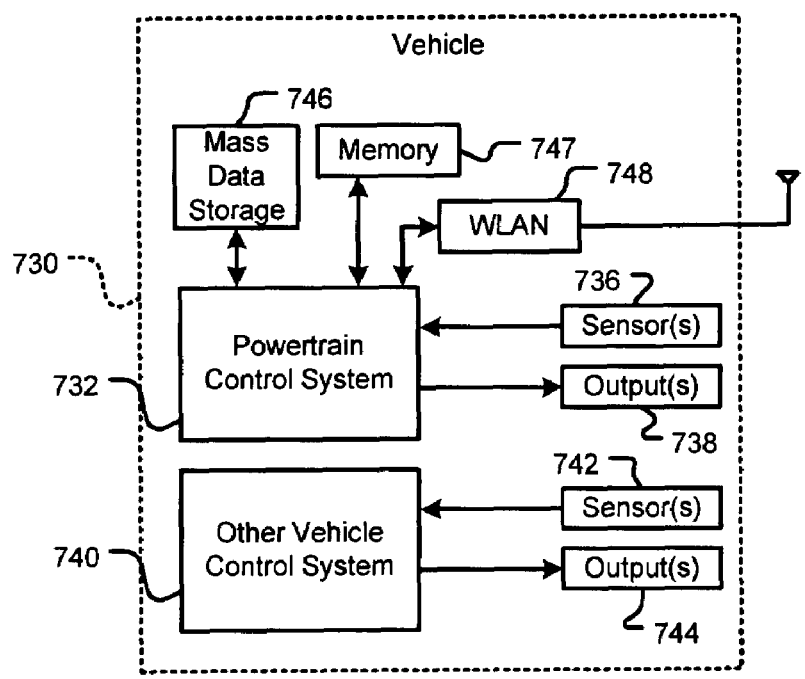
Figure 10E:
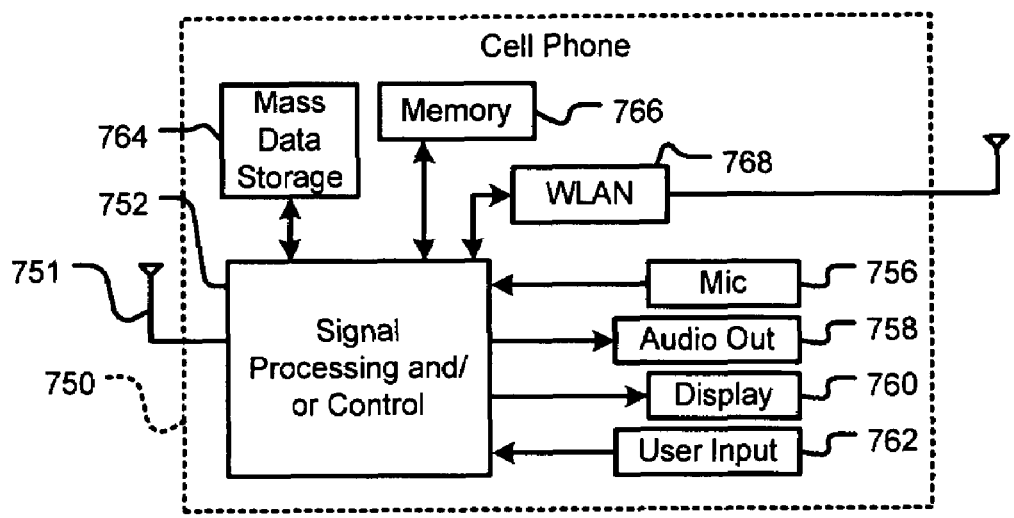

Referring now to FIG. 10D, the present invention can be implemented in a control system of a vehicle 930, a WLAN interface and/or mass data storage of the vehicle control system. In some implementations, the present invention implement a powertrain control system 932 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 940 of the vehicle 930. The control system 940 may likewise receive signals from input sensors 942 and/or output control signals to one or more output devices 944. In some implementations, the control system 940 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 932 may communicate with mass data storage 946 that stores data in a nonvolatile manner. The mass data storage 946 may include optical and/or magnetic storage devices (for example, hard disk drives [HDDs] and/or DVDs). At least one HDD may have the configuration shown in FIG. 10A and/or at least one DVD may have the configuration shown in FIG. 10B. The HDD may be a mini HDD that includes one or more platters having a diameter that is smaller than approximately 1.8". The powertrain control system 932 may be connected to memory 947 such as RAM, ROM, low latency nonvolatile memory such as flash memory and/or other suitable electronic data storage. The powertrain control system 932 also may support connections with a WLAN via a WLAN network interface 948. The control system 940 may also include mass data storage, memory and/or a WLAN interface (all not shown).

Referring now to FIG. 1E, the present invention can be implemented in a cellular phone 950 that may include a cellular antenna 951. The present invention may implement either or both signal processing and/or control circuits, which are generally identified in FIG. 10E at 952, a WLAN interface and/or mass data storage of the cellular phone 950. In some implementations, the cellular phone 950 includes a microphone 956, an audio output 958 such as a speaker and/or audio output jack, a display 960 and/or an input device 962 such as a keypad, pointing device, voice actuation and/or other input device. The signal processing and/or control circuits 952 and/or other circuits (not shown) in the cellular phone 950 may process data, perform coding and/or encryption, perform calculations, format data and/or perform other cellular phone functions.

The cellular phone 950 may communicate with mass data storage 964 that stores data in a nonvolatile manner such as optical and/or magnetic storage devices (for example, hard disk drives [HDDs] and/or DVDs). At least one HDD may have the configuration shown in FIG. 10A and/or at least one DVD may have the configuration shown in FIG. 10B. The HDD may be a mini HDD that includes one or more platters having a diameter that is smaller than approximately 1.8". The cellular phone 950 may be connected to memory 966 such as RAM, ROM, low latency nonvolatile memory such as flash memory and/or other suitable electronic data storage. The cellular phone 950 also may support connections with a WLAN via a WLAN network interface 968.

Figure 10F:
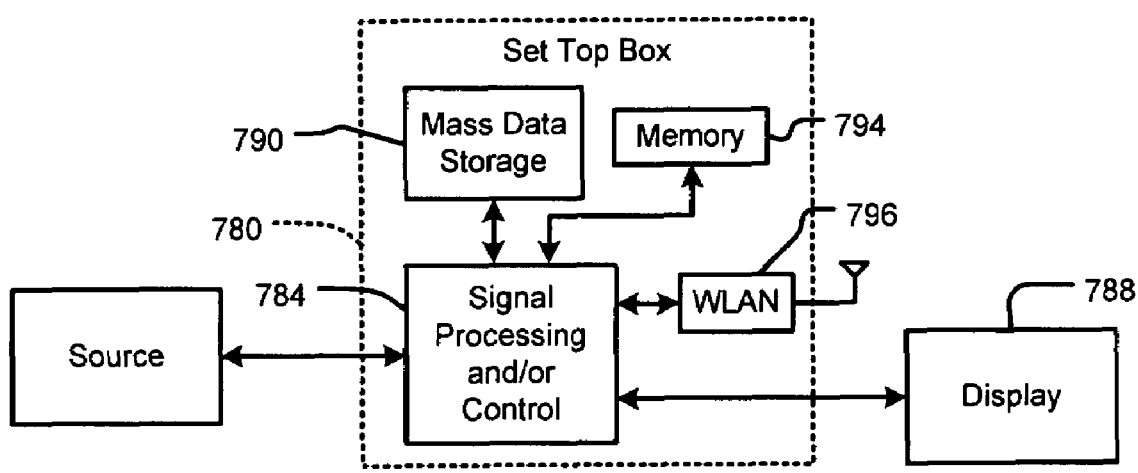

Referring now to FIG. 10F, the present invention can be implemented in a set top box 980. The present invention may implement either or both signal processing and/or control circuits, which are generally identified in FIG. 10F at 984, a WLAN interface and/or mass data storage of the set top box 980. The set top box 980 receives signals from a source such as a broadband source and outputs standard and/or high definition audio/video signals suitable for a display 988 such as a television and/or monitor and/or other video and/or audio output devices. The signal processing and/or control circuits 984 and/or other circuits (not shown) of the set top box 980 may process data, perform coding and/or encryption, perform calculations, format data and/or perform any other set top box function.

The set top box 980 may communicate with mass data storage 990 that stores data in a nonvolatile manner. The mass data storage 990 may include optical and/or magnetic storage devices (for example, hard disk drives [HDDs] and/or DVDs). At least one HDD may have the configuration shown in FIG. 10A and/or at least one DVD may have the configuration shown in FIG. 10B. The HDD may be a mini HDD that includes one or more platters having a diameter that is smaller than approximately 1.8". The set top box 980 may be connected to memory 994 such as RAM, ROM, low latency nonvolatile memory such as flash memory and/or other suitable electronic data storage. The set top box 980 also may support connections with a WLAN via a WLAN network interface 996.

Figure 10G:
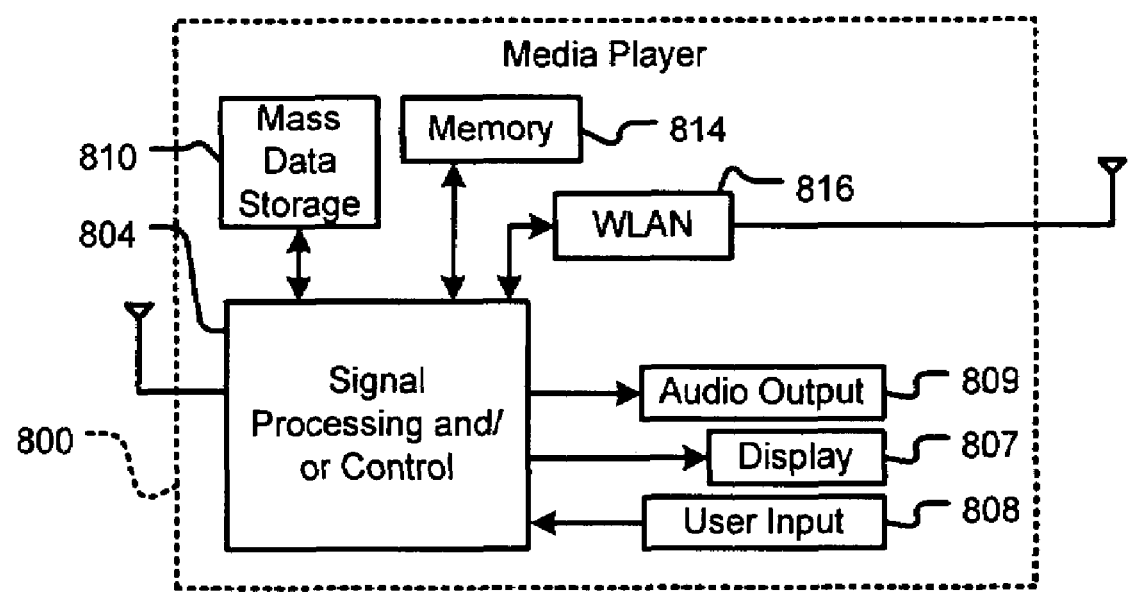

Referring now to FIG. 10G, the present invention can be implemented in a media player 1000. The present invention may implement either or both signal processing and/or control circuits, which are generally identified in FIG. 10G at 1004, a WLAN interface and/or mass data storage of the media player 1000. In some implementations, the media player 1000 includes a display 1007 and/or a user input 1008 such as a keypad, touchpad and the like. In some implementations, the media player 1000 may employ a graphical user interface (GUI) that typically employs menus, drop down menus, icons and/or a point-and-click interface via the display 1007 and/or user input 1008. The media player 1000 further includes an audio output 1009 such as a speaker and/or audio output jack. The signal processing and/or control circuits 1004 and/or other circuits (not shown) of the media player 1000 may process data, perform coding and/or encryption, perform calculations, format data and/or perform any other media player function.

The media player 1000 may communicate with mass data storage 1010 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices (for example, hard disk drives [HDDs] and/or DVDs). At least one HDD may have the configuration shown in FIG. 10A and/or at least one DVD may have the configuration shown in FIG. 10B. The HDD may be a mini HDD that includes one or more platters having a diameter that is smaller than approximately 1.8". The media player 1000 may be connected to memory 1014 such as RAM, ROM, low latency nonvolatile memory such as flash memory and/or other suitable electronic data storage. The media player 1000 also may support connections with a WLAN via a WLAN network interface 1016. Still other implementations in addition to those described above are contemplated.

CONCLUSION/SUMMARY

Thus, the present invention provides an apparatus and method for adjusting baseline offset of an analog signal in a read channel of an analog storage device. In particular, embodiments of the present invention relate to circuits and methods for baseline loop analog cancellation in a read channel.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. An apparatus for adjusting an analog input signal, comprising:
    a first mixer configured to combine said analog input signal and an adjustment signal;
    an analog signal conditioning circuit, configured to receive an output from the first mixer and to provide a conditioned analog signal;
    an analog-to-digital converter (ADC) configured to convert said conditioned analog signal to a first digital signal;
    a first logic block configured to provide a correction signal and said adjustment signal; and
    a second mixer configured to combine said first digital signal and said correction signal, and to provide a second digital signal.

2. The apparatus of claim 1, wherein said ADC is configured to provide said first digital signal to a digital signal conditioning circuit.

3. The apparatus of claim 1, further comprising a memory having a look-up table, said memory being coupled to said first logic block.

4. The apparatus of claim 1, further comprising a digital-to-analog converter (DAC), said DAC being configured to receive a digital adjustment signal from said first logic block, and to provide an analog adjustment signal to said first mixer.

5. The apparatus of claim 1, further comprising a high-pass filter (HPF) configured to provide said analog input signal.

6. The apparatus of claim 1, further comprising a second logic block configured to receive said second digital signal and to provide a digital feedback signal to said first logic block.

7. The apparatus of claim 6, wherein said digital feedback signal comprises a sign bit and a plurality of absolute value bits.

8. The apparatus of claim 1, wherein said first logic block comprises:
    an accumulator configured to receive an output from a multiplexer, wherein said multiplexer is configured to receive a gain-controlled output from a third mixer; and
    a delay circuit coupled to said accumulator, wherein said delay circuit is configured to provide said correction signal.

9. The apparatus of claim 1, wherein said analog signal conditioning circuit comprises a variable gain amplifier (VGA).

10. The apparatus of claim 9, wherein said analog signal conditioning circuit further comprises a continuous time filter (CTF).

11. The apparatus of claim 9, wherein said analog signal conditioning circuit further comprises a magnetoresistive asymmetry correction circuit.

12. The apparatus of claim 2, wherein said digital signal conditioning circuit comprises a finite impulse response (FIR) circuit coupled to a conditioning circuit mixer.

13. A method of adjusting an analog input signal, comprising:
    mixing said analog input signal with an analog adjustment signal to provide an adjusted analog input signal;
    converting said adjusted analog input signal to a first digital signal;
    mixing a correction signal and said first digital signal to provide a second digital signal;
    generating a digital feedback signal from said second digital signal; and generating said analog adjustment signal and said correction signal from said second digital signal and a stored correction signal.

14. The method of claim 13, further comprising:

storing a plurality of entries in a look-up table in a memory, wherein said plurality of entries comprises said stored correction signal;

providing indexing for said look-up table using a gain calibration signal, said gain calibration signal being an input to a data gain converter; and receiving an output of said data gain converter and said adjusted analog input signal in a variable gain amplifier (VGA).

15. The method of claim 14, further comprising adjusting said gain calibration signal during a calibration mode.

16. The method of claim 15, wherein said calibration mode comprises using an auxiliary capacitor for calibrating a digital-to-analog converter (DAC), said DAC providing said analog adjustment signal from a digital adjustment signal.

17. The method of claim 13, further comprising averaging said digital feedback signal.

18. The method of claim 14, further comprising receiving a gain signal from said look-up table in an accumulator, and providing said correction signal from said accumulator.

19. The method of claim 18, further comprising receiving gain ratio and time constant ratio signals in said accumulator.

20. The method of claim 18, further comprising substantially matching a first delay of a first signal path to a second delay of a second signal path, wherein:

said first signal path comprises a digital-to-analog converter (DAC), an first mixer, a variable gain amplifier (VGA), and a finite impulse response (FIR) circuit; and said second signal path comprises said accumulator and a delay circuit.

* * * * *